US009583551B2

(12) United States Patent
Zhang et al.

(10) Patent No.: US 9,583,551 B2
(45) Date of Patent: Feb. 28, 2017

(54) OLED ARRAY SUBSTRATE, METHOD FOR FABRICATING THE SAME, AND DISPLAY DEVICE

(71) Applicants: BOE TECHNOLOGY GROUP CO., LTD., Beijing (CN); Hefei Xinsheng Optoelectronics Technology Co., Ltd., Anhui (CN)

(72) Inventors: Yuting Zhang, Beijing (CN); Chunwei Wu, Beijing (CN)

(73) Assignees: Boe Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 0 days.

(21) Appl. No.: 14/435,808

(22) PCT Filed: Jul. 14, 2014

(86) PCT No.: PCT/CN2014/082135
§ 371 (c)(1),
(2) Date: Sep. 17, 2015

(87) PCT Pub. No.: WO2015/135270
PCT Pub. Date: Sep. 17, 2015

(65) Prior Publication Data
US 2016/0247873 A1  Aug. 25, 2016

(30) Foreign Application Priority Data
Mar. 11, 2014  (CN) .......................... 2014 1 0087714

(51) Int. Cl.
*H01L 29/15* (2006.01)
*H01L 27/32* (2006.01)
*H01L 51/52* (2006.01)

(52) U.S. Cl.
CPC ...... *H01L 27/3279* (2013.01); *H01L 27/3258* (2013.01); *H01L 51/5212* (2013.01);
(Continued)

(58) Field of Classification Search
CPC ............. H01L 27/3279; H01L 27/3258; H01L 27/3276; H01L 51/5212; H01L 51/5228; H01L 51/5234
(Continued)

(56) References Cited

U.S. PATENT DOCUMENTS 7,423,638 B2  9/2008  Kwon
2002/0104995 A1  8/2002  Yamazaki et al.
(Continued)

FOREIGN PATENT DOCUMENTS

CN  1825614  8/2006
CN  1885563  12/2006
(Continued)

OTHER PUBLICATIONS

Office action from Chinese Application No. 201410087714.0 dated Dec. 24, 2015.
(Continued)

*Primary Examiner* — Tu-Tu Ho
(74) *Attorney, Agent, or Firm* — Calfee, Halter & Griswold LLP

(57) ABSTRACT

Embodiments provide an OLED array substrate, a method for fabricating the same, and a display device. The present invention relates to the field of display technology, can decrease resistivity of an electrode, and avoid increase in patterning process. The OLED array substrate comprises an effective pixel display area and a peripheral wiring area. The effective pixel display area comprises a TFT which is arranged on a base plate. The array substrate further comprises a plurality of conductors which are arranged between
(Continued)

the base plate and the first electrode; wherein, in the peripheral wiring area, the plurality of conductors are connected with the second electrode.

16 Claims, 5 Drawing Sheets

(52) U.S. Cl.
CPC ...... *H01L 51/5228* (2013.01); *H01L 51/5234* (2013.01); *H01L 2227/323* (2013.01)

(58) Field of Classification Search
USPC .......................................................... 257/72
See application file for complete search history.

(56) References Cited

U.S. PATENT DOCUMENTS

| | | | | |
|---|---|---|---|---|
| 2006/0113900 A1* | 6/2006 | Oh | ...................... | H01L 27/3276 313/504 |
| 2010/0060147 A1* | 3/2010 | Eom | ................... | H01L 51/5212 313/504 |
| 2012/0229437 A1* | 9/2012 | Park | ................... | H01L 27/3276 345/211 |

FOREIGN PATENT DOCUMENTS

| CN | 101931059 | 12/2010 |
|---|---|---|
| CN | 102544369 | 7/2012 |
| CN | 202816958 | 3/2013 |
| CN | 103943655 | 7/2014 |
| CN | 203721731 | 7/2014 |

OTHER PUBLICATIONS

International Search Report and Written Opinion from PCT/CN2014/082135 dated Dec. 17, 2014.

Office action from Chinese Application No. 2014100877140 dated Jun. 26, 2015.

* cited by examiner

| forming in sequence a second gate 207, a second insulating layer 206, a second MOS active layer 203b, a source 204, a drain 205, a first MOS active layer 203a, and a first insulating layer 202 on a base plate 10; wherein the first MOS active layer 203a contacts the second MOS active layer 203b via a gap between the source 204 and the drain 205 | S101 |

| forming a first gate 201 in the effective pixel display area 01, and at the same time, forming a plurality of metal lines 60 which are parallel with each other; wherein the metal lines 60 and the first gate 201 are insulated from each other, and any one of the metal lines 60 extends from the effective pixel display area 01 to the peripheral wiring area 02 | S102 |

| forming in sequence an adhesion layer 80 and an organic insulating layer 70 in the effective pixel display area 01 and the peripheral wiring area 02 | S103 |

| forming in sequence a first electrode 30 and an organic material functional layer 40 in the effective pixel display area 01; wherein the first electrode 30 is electrically connected with the drain 205 via a via hole through the organic insulating layer 70, the adhesion layer 80, and the first insulating layer 202 | S104 |

| forming a second electrode 50 in the effective pixel display area 01 and the peripheral wiring area 02; wherein the second electrode 50 in the peripheral wiring area 02 is electrically connected with each of the metal lines 60 via a via hole in the peripheral wiring area 02 through the organic insulating layer 70 and the adhesion layer 80 | S105 |

Fig. 9

OLED ARRAY SUBSTRATE, METHOD FOR FABRICATING THE SAME, AND DISPLAY DEVICE

RELATED APPLICATIONS

The present application is the U.S. national stage entry of PCT/CN2014/082135, filed Jul. 14, 2014, which claims the benefit of Chinese Patent Application No. 201410087714.0, filed Mar. 11, 2014, the entire disclosure of which is incorporated herein by reference.

FIELD OF THE INVENTION

The present invention relates to the field of display technology, and particularly to an OLED array substrate, a method for fabricating the same, and a display device.

BACKGROUND ART

An organic light emitting diode (OLED) is an organic thin film electroluminescent device. It has advantages of having a simple fabricating process, a low cost, high luminous efficiency, easily forms a flexible structure, and has a wide viewing angle. Thus, the display technology in which the organic light emitting diode is applied has become an important display technology.

Currently, an OLED display device can be divided into a top-emitting type, a bottom-emitting type, and a double-side-emitting type, based on the light emitting direction. For all types of OLED display devices, it is generally required that one of the cathode and anode be made from a transparent material, so that light can be emitted through the electrode made from the transparent material.

For example, in an array substrate for a top-emitting OLED, the cathode is made from indium tin oxide (ITO) of high resistivity, an anode made of a metallic material, and a functional layer of an organic material therebetween. The functional layer emits light which is emitted outside through the transparent cathode.

Since the transparent ITO has a relatively high resistivity, the cathode suffers from a drop in voltage, which adversely affects the performance of the OLED display device.

In the prior art, a patterned metal layer is formed on a package substrate of the OLED display device, and an ITO layer is formed to contact the metal layer and further contact the ITO cathode of the OLED array substrate to improve resistivity of the cathode. However, this method is complicated to fabricate, which leads to an increase in cost and a decrease in productivity.

SUMMARY

Embodiments of the present invention provide an OLED array substrate, a method for fabricating the same, and a display device, which can decrease resistivity of the electrode and simplify the fabricating process.

To this end, the following technical solutions are adopted in embodiments of the present invention.

In one aspect, embodiments of the present invention provide an OLED array substrate, comprising an effective pixel display area and a peripheral wiring area, wherein the effective pixel display area comprises a thin film transistor (TFT) which is arranged on a base plate; and a first electrode, an organic material functional layer, and a transparent second electrode, which are arranged in sequence on a side of the TFT away from the base plate. The array substrate further comprises a plurality of conductors which are arranged between the base plate and the first electrode. In the peripheral wiring area, the plurality of conductors is connected to the second electrode.

Preferably, the plurality of conductors comprises a plurality of metal lines. More preferably, the plurality of metal lines lie in the same layer. More preferably, the plurality of metal lines are located in both the effective pixel display area and the peripheral wiring area.

Preferably, the TFT comprises a first gate that is arranged closer to the first electrode than a source and a drain of the TFT, and that the first gate and the plurality of metal lines are arranged in the same layer and are insulated from each other.

More preferably, the array substrate further comprises an organic insulating layer that is arranged between the first gate and the first electrode.

Preferably, the TFT further comprises a second gate, corresponding to the first gate in the perpendicular direction, and arranged closer to the base plate than the source and the drain.

The TFT may be further comprised of a metal-oxide-semiconductor (MOS) active layer-arranged between the first gate and the second gate.

More preferably, the MOS active layer comprises a first MOS active layer and a second MOS active layer, with the first MOS active layer arranged close to the first gate, the second MOS active layer arranged close to the second gate, and the first MOS active layer in contact with the second MOS active layer via a gap between a source and a drain.

The first electrode may be electrically connected with the drain of the TFT. Further, the first electrode may comprise a metallic conducting layer.

In another aspect, an embodiment of the present invention provides an OLED display device, which comprises the OLED array substrate as mentioned above, and a package layer.

In a further aspect, an embodiment of the present invention provides a method for fabricating an OLED array substrate, comprising: forming a TFT in an effective pixel display area of a base plate; and forming in sequence a first electrode, an organic material functional layer and a transparent second electrode on the substrate on which the TFT has been formed. The method further comprises: forming a plurality of conductors between the base plate and the first electrode. In the peripheral wiring area, the plurality of conductors is connected with the second electrode.

Preferably, the plurality of conductors is a plurality of metal lines. More preferably, the plurality of metal lines lies in the same layer. More preferably, the plurality of metal lines is located in both the effective pixel display area and the peripheral wiring area.

Preferably, the TFT comprises a first gate which is arranged closer to the first electrode than a source and a drain of the TFT.

Forming the plurality of metal lines which lies in the same layer comprises: forming the plurality of metal lines at the same time for forming the first gate, wherein the first gate and the plurality of metal lines are insulated from each other.

More preferably, after forming the first gate and the plurality of metal lines which lie in the same layer as the first gate, and prior to forming the first electrode, the method further comprises forming an organic insulating layer.

Preferably, the TFT further comprises a second gate, which corresponds to the first gate in the perpendicular direction, and which is arranged closer to the base plate than the source and the drain.

Based on the foregoing description, forming the TFT in the effective pixel display area of the base plate preferably comprises:

forming in sequence a second gate, a second insulating layer, a second MOS active layer, a source and a drain, a first MOS active layer, a first insulating layer, and a first gate on the base plate, wherein the first MOS active layer contacts the second MOS active layer via a gap between a source and a drain.

An embodiment of the present invention provides an OLED array substrate, a method for fabricating the same, and a display device. The OLED array substrate comprises an effective pixel display area and a peripheral wiring area. The effective pixel display area comprises a TFT which is arranged on a base plate, a first electrode, an organic material functional layer and a transparent second electrode which are arranged in sequence on a side of the TFT away from the base plate. The array substrate further comprises a plurality of conductors which is arranged between the base plate and the first electrode. The plurality of metal lines is located in both the effective pixel display area and the peripheral wiring area. In the peripheral wiring area, the plurality of metal lines is connected with the second electrode. By arranging the metal lines, it is possible for the metal lines and the second electrode which are connected in parallel to act as an electrode of the array substrate, thus reducing resistivity of the electrode. In this manner, it is only required to form the plurality of metal lines which lies in the same layer and which is connected with the second electrode only in the peripheral wiring area. As compared with the prior art, this method is more efficient.

BRIEF DESCRIPTION OF DRAWINGS

This and other aspects of the present invention will now be described in more detail, with reference to the appended drawings showing currently preferred embodiments of the present invention.

FIG. 9 is a flowchart illustrating a method for fabricating an OLED array substrate in an embodiment of the present invention.

DETAILED DESCRIPTION OF EMBODIMENTS

Several technical solutions of the present disclosure will be described in more detail below with reference to the accompanying drawings in order for those skilled in the art to be able to carry out the present disclosure. The present disclosure may, however, be embodied in many different forms and should not be construed as limited to embodiments set forth herein. These embodiments do not limit the present disclosure, but the present disclosure is only limited by the appended claims.

The following reference numbers will be used throughout the specification and accompanying figures: 01—effective pixel display area; 02—peripheral wiring area; 10—base plate; 20—TFT; 201—first gate; 202—first insulating layer; 203—semiconductor active layer; 203a—first MOS active layer; 203b—second MOS active layer; 204—source; 205—drain; 206—second insulating layer; 207—second gate; 30—first electrode; 40—organic material functional layer; 50—second electrode; 60—metal line; 70—organic insulating layer; 80—adhesion layer; 90—package layer.

Figure 1:
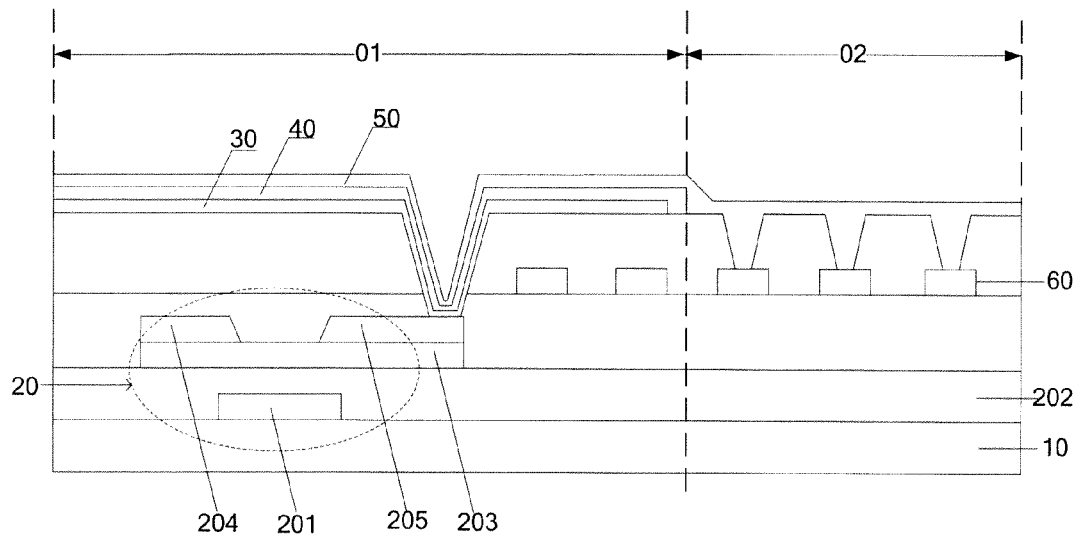
FIG. 1 is a first structural view illustrating an OLED array substrate in an embodiment of the present invention.
Figure 2:
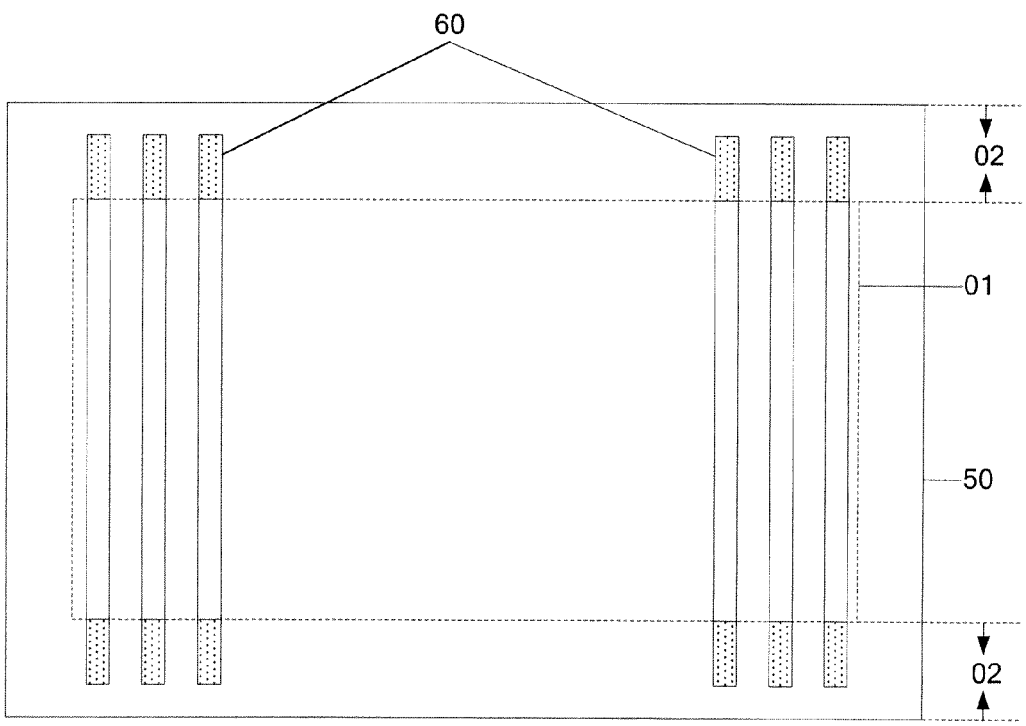
FIG. 2 is a second structural view illustrating an OLED array substrate in an embodiment of the present invention.

An embodiment of the present invention provides an OLED array substrate. As shown in FIGS. 1-2, the array substrate comprises an effective pixel display area 01 and a peripheral wiring area 02. The effective pixel display area 01 comprises: a TFT 20 which arranged on a base plate 10. The effective pixel display area 01 further comprises a first electrode 30, an organic material functional layer 40, and a transparent second electrode 50 arranged in sequence on a side of the TFT 20 away from the base plate 10. The array substrate further comprises a plurality of conductors 60 arranged between the base plate 10 and the first electrode 30. In the peripheral wiring area 02, the plurality of conductors 60 are connected with the second electrode 50.

Preferably, the plurality of conductors 60 are comprised of a plurality of metal lines 60. More preferably, the plurality of metal lines 60 lie in the same layer. More preferably, the plurality of metal lines 60 are located in both the effective pixel display area 01 and the peripheral wiring area 02.

The TFT 20 comprises a first gate 201, a first insulating layer 202, a semiconductor active layer 203, a source 204, and a drain 205.

It is noted that, firstly, in embodiments of the present invention, the first electrode 30 can be a cathode. In this case, the second electrode 50 and the metal lines 60 which are electrically connected with the second electrode 50 together constitute the anode. Alternatively, the first electrode 30 can be an anode. In this case, the second electrode 50 and the metal lines 60 which are electrically connected with the second electrode 50 together constitute the cathode.

It will be appreciated by a person skilled in the art that one of the first electrode 30 and the second electrode 50 should be electrically connected with the drain 205 of the TFT 20, depending on the practical conditions. There is no restriction about which one of the first and second electrodes should be electrically connected with the drain.

The first electrode 30 can be made from a transparent material or an opaque material. There is no restriction to the material of the first electrode. Herein, with respect to the base plate 10, when the first electrode 30 is made from an opaque material and the second electrode 50 is made from a transparent material, the OLED array substrate is a top-emitting OLED array substrate. When the first electrode 30 is made from a transparent material and the second electrode 50 is made from a transparent material, the OLED array substrate is a double-side-emitting OLED array substrate.

There is no restriction to the number of the metal lines 60, and the plurality of metal lines 60 can be arranged in a parallel manner. Further, the plurality of metal lines 60 can be electrically connected with each other, or not electrically connected with each other. Additionally, there is no restriction to the type of the TFT 20, and the TFT 20 can be a bottom-gate type, a top-gate type, or a double-gate type.

The organic material functional layer 40 may be comprised of an electron transporting layer, a light emitting layer, and a hole transporting layer. To improve the efficiency for electrons and holes to inject to the light emitting layer, the organic material functional layer 40 preferably can further comprise an electron injection layer between the second electrode 50 and the electron transporting layer, and an hole injection layer between the first electrode 30 and the hole transporting layer.

Drawings for all embodiments in the present invention only schematically illustrate patterned layers relevant with the present inventive concept, while patterned layers irrelevant with the present inventive concept are partially or not illustrated.

In some embodiments, an OLED array substrate, is comprised of an effective pixel display area 01 and a peripheral wiring area 02. The effective pixel display area 01 includes a TFT 20 which is arranged on the base plate 10. Additionally, a first electrode 30, an organic material functional layer 40, and a transparent second electrode 50 are arranged in sequence on a side of the TFT 20 away from the base plate 10. The array substrate further includes a plurality of metal lines 60 arranged between the base plate 10 and the first electrode 30 and lies in the same layer. The plurality of metal lines 60 are located in both the effective pixel display area 01 and the peripheral wiring area 02. In the peripheral wiring area 02, the plurality of metal lines 60 are connected to the second electrode 50. By arranging the metal lines 60, it is possible for the metal lines 60 and the second electrode 50, which are connected in parallel, to act as an electrode of the array substrate, thus reducing resistivity of the electrode. In this manner, the plurality of metal lines 60 that lie in the same layer and that are connected with the second electrode 50 need be formed in the peripheral wiring area only. As compared with the prior art, this method is more efficient.

Optionally, as shown in FIG. 1, due to the particularity of a material for the organic material functional layer 40 in an OLED, it is difficult for the electrode currently electrically connected with the drain 205 to cross the organic material functional layer 40 so as to be electrically connected with the drain 205. Thus, in some embodiments, it is preferable for the first electrode 30 to be electrically connected with the drain 205 of the TFT.

In embodiments where the first electrode 30 is an anode, a cathode comprised of the second electrode 50 and the metal lines has a constant voltage. In embodiments where the first electrode 30 is a cathode, an anode comprised of the second electrode 50 and the metal lines has a constant voltage.

In some embodiments, the first electrode 30 can be a structure comprising metallic conducting layers. For example, the first electrode 30 can be a two-layer structure comprising an AlNd conducting layer and a MoNb conducting layer. In this way, the light emitted from the organic material functional layer 40 can be directly emitted through the second electrode 50 (top-emitting type), and it is not necessary to consider whether the thickness of the metal lines 60 affects the outgoing light. Thus, in embodiments of the present invention, the array substrate is preferably a top-emitting type OLED array substrate. Of course, the first electrode 30 can also be a three-layer structure comprising an ITO layer, an Ag conducting layer, and an ITO layer.

Figure 3:
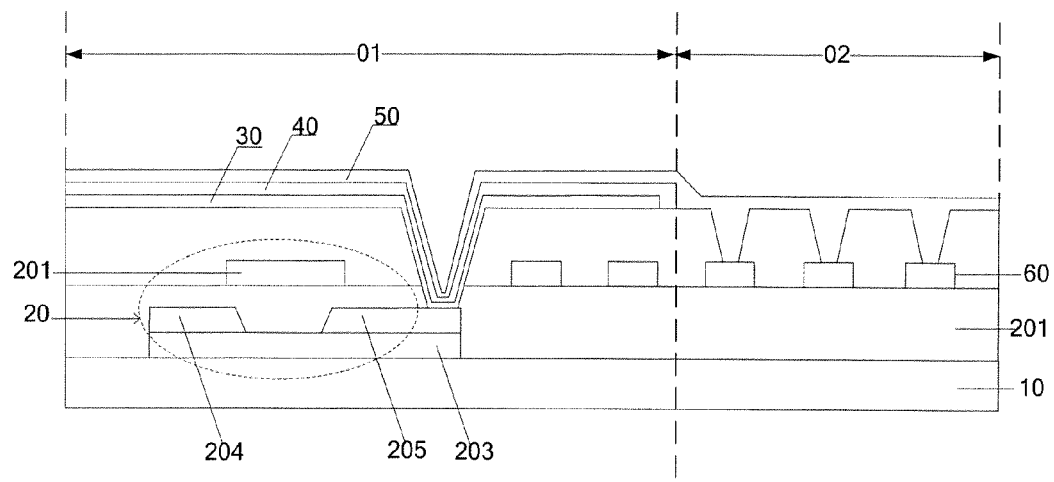
FIG. 3 is a structural view illustrating an OLED array substrate in an embodiment of the present invention, wherein metal lines and a first gate lie in the same layer.

Based on the foregoing description, preferably, as shown in FIG. 3, the first gate 201 of the TFT 20 is arranged closer to the first electrode 30 than the source 204 and the drain 205 of the TFT 20. The first gate 201 and the plurality of metal lines 60 are arranged in the same layer and are insulated from each other. In this arrangement, since the first gate 201 and the metal lines 60 lie in the same layer, they can be formed in the same patterning process, thus avoiding additionally patterning.

Figure 4:
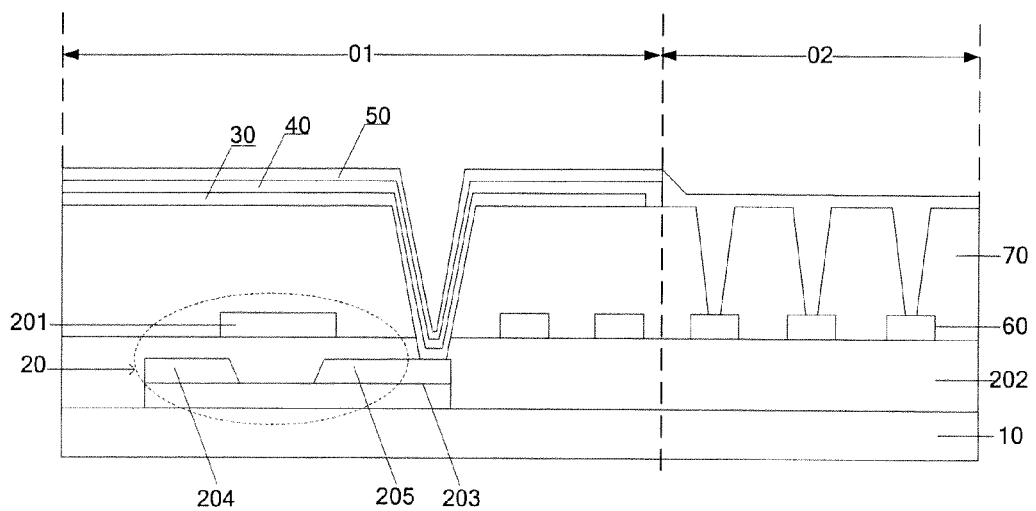
FIG. 4 is a structural view illustrating an OLED array substrate comprising an organic insulating layer in an embodiment of the present invention.
Figure 5:
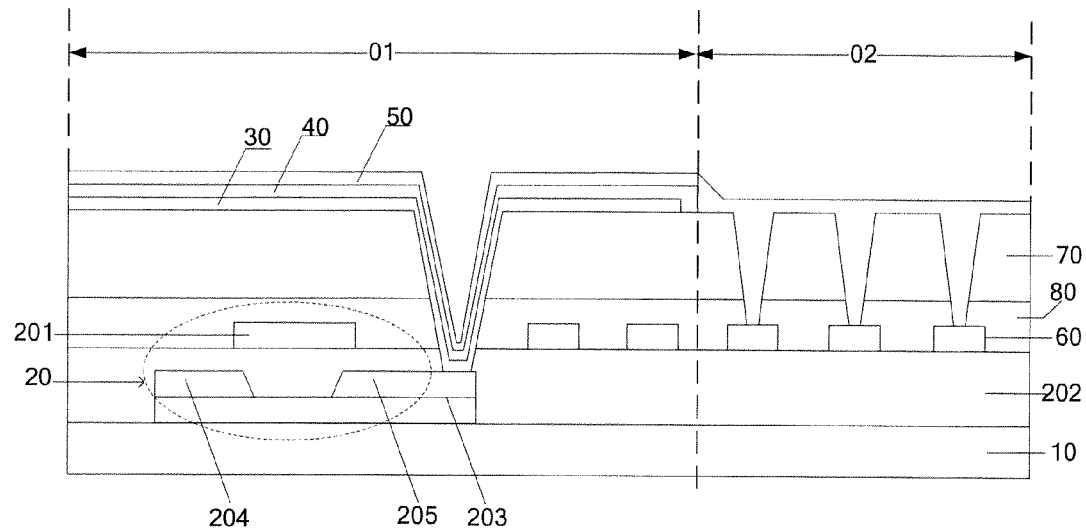
FIG. 5 is a structural view illustrating an OLED array substrate comprising an adhesion layer and an organic insulating layer in an embodiment of the present invention.

More preferably, as shown in FIG. 4, the array substrate further comprises an organic insulating layer 70 arranged between the first gate 201/the metal lines 60 and the first electrode 30. Since the organic insulating layer 70 can be relatively thick, the effect of a scanning signal of the first gate 201 on a voltage of the first electrode 30 can be avoided as much as possible by setting the thickness of the organic insulating layer 70 appropriately. Further, since the adhesion between the organic insulating layer 70 and the underlying components (the first gate 201 and metal lines 60), which are made from metallic materials, may not be strong, an adhesion layer 80 may be arranged between the organic insulating layer 70 and the underlying components (first gate 201 and the metal lines 60), as shown in FIG. 5. The adhesion layer 80 intends to improve the adhesion strength between the organic insulating layer 70 and the first gate 201/the metal lines 60 of metallic materials.

Figure 6:
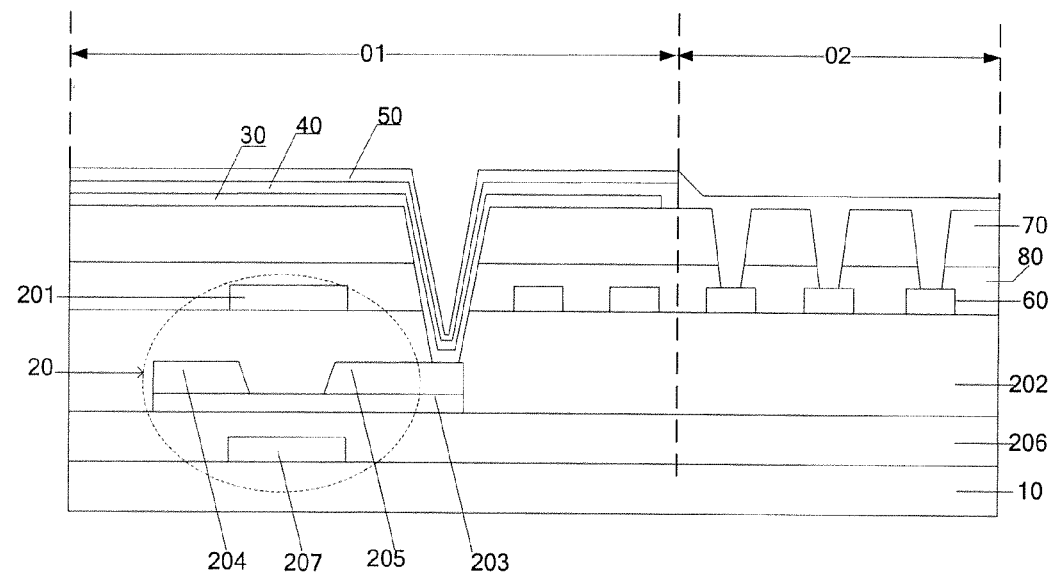
FIG. 6 is a structural view illustrating an OLED array substrate comprising a double-gate TFT in an embodiment of the present invention.

Optionally, as shown in FIG. 6, the TFT 20 can further comprise a second gate 207, which corresponds to the first gate 201 in the perpendicular direction and is arranged closer to the base plate 10 than the source 204 and the drain 205. In this embodiment, a double-gate TFT is applied so as to increase the ON-state current, decrease the OFF-state current, and increase the threshold voltage stability of the TFT. Further, since a MOS has advantages of high electron mobility and excellent uniformity, it is preferred that a MOS active layer is set as a semiconductor active layer between the first gate 201 and the second gate 207. The MOS active layer can be made from a material like ZnO, IGZO, InZnO, ZnSnO. When the MOS active layer is arranged below the source 204 and the drain 205, an etching stop layer can be arranged over the MOS active layer to avoid over-etching the MOS active layer during forming the source/drain electrode by etching.

Figure 7:
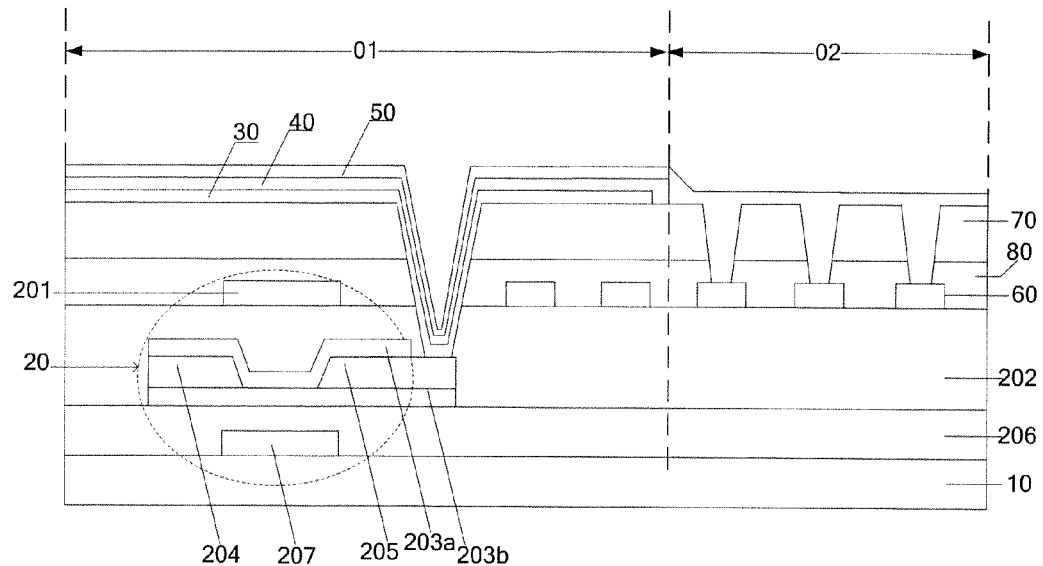
FIG. 7 is a structural view illustrating an OLED array substrate comprising a TFT with two MOS active layers in an embodiment of the present invention.

Further, in some embodiments, another MOS active layer can be formed to avoid over-etching the MOS active layer during forming the source/drain electrode over the MOS active layer by etching. As shown in FIG. 7, two MOS active layers are formed. A first MOS active layer 203a is arranged close to the first gate 201, a second MOS active layer 203b is arranged close to the second gate 207, and the first MOS active layer 203a contacts the second MOS active layer 203b via a gap between the source 204 and the drain 205. Due to the presence of the second MOS active layer 203b over the source 204 and the drain 205, even if the first MOS active layer 203a underlying the source 204 and the drain 205 is over-etched during forming the source 204 and the drain 205, the performance of the TFT will not be affected as long as the second MOS active layer 203b contacts the first MOS active layer 203a. In some embodiments of the TFT 20, a first insulating layer 202 can be further arranged between the first gate 201 and the first MOS active layer 203a; and a second insulating layer 206 can be further arranged between the second gate 207 and the second MOS active layer 203b.

Figure 8:
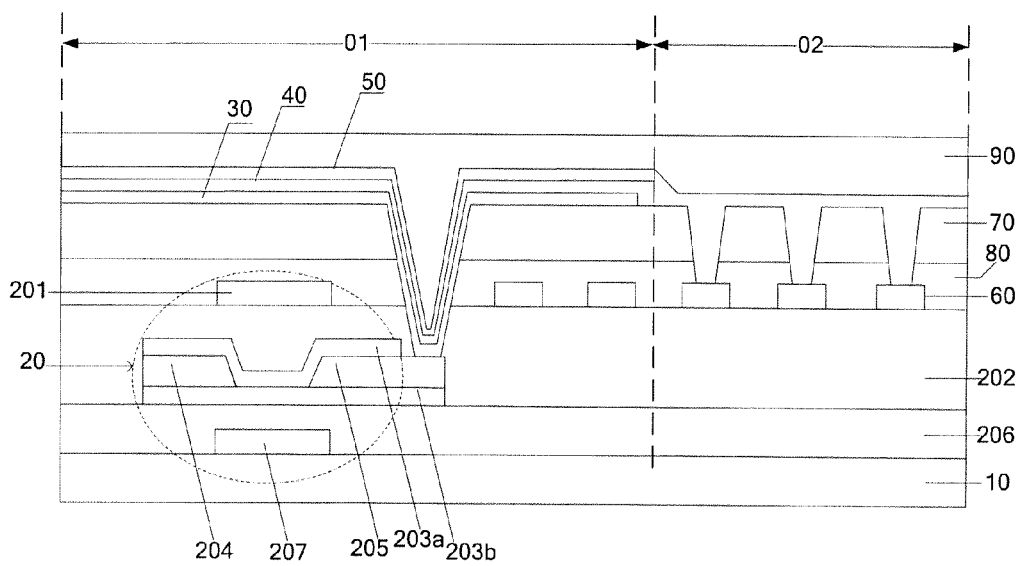
FIG. 8 is a structural view illustrating an OLED display device in an embodiment of the present invention.

An embodiment of the present invention further provides an OLED display device. As shown in FIG. 8, the display device comprises the OLED array substrate as mentioned above and a package layer 90. The package layer 90 can be a thin package film or a package substrate. The OLED display device can be any product or component with a display function, such as an OLED TV, an OLED display device, a digital photo frame, a mobile phone, and/or a tablet computer.

An embodiment of the present invention further provides a method for fabricating an OLED array substrate. As shown in FIGS. 1-2, the method comprises: forming a TFT 20 in an effective pixel display area 01 of a base plate 10; and forming in sequence a first electrode 30, an organic material functional layer 40, and a transparent second electrode 50 on the substrate on which the TFT 20 has been formed. The method further comprises: forming a plurality of conductors 60 between the base plate 10 and the first electrode 30. In the peripheral wiring area 02, the plurality of metal lines 60 is connected with the second electrode 60.

In some embodiments, the plurality of conductors 60 is a plurality of metal lines 60. The plurality of metal lines 60 may lie in the same layer. The plurality of metal lines 60 may be located in both the effective pixel display area 01 and the peripheral wiring area 02. The TFT 20 may include a first gate 201, a first insulating layer 202, a semiconductor active layer 203, a source 204, and a drain 205.

It will be appreciated by a person skilled in the art that one of the first electrode 30 and the second electrode 50 should be electrically connected with the drain 205 of the TFT 20. There is no restriction about which one of the first and second electrodes should be electrically connected with the drain. There is no restriction to the type of the TFT 20, and the TFT 20 can be a bottom-gate type, a top-gate type, or a double-gate type.

The plurality of metal lines 60 can be electrically connected with each other, or not electrically connected with each other. Further, there is no restriction for the position where the metal lines 60 are formed, as long as the metal lines 60 can be connected to the second electrode 60 in the peripheral wiring area 02 and the fabricating process is relatively efficient.

An embodiment of the present invention provides a method for fabricating an OLED array substrate, comprising: forming a TFT 20 in an effective pixel display area 01 of a base plate 10; and forming in sequence a first electrode 30, an organic material functional layer 40, and a transparent second electrode 50 on the substrate on which the TFT 20 has been formed. The method further comprises: forming a plurality of metal lines 60 in the same layer between the base plate 10 and the first electrode 30. The plurality of metal lines 60 is located in both the effective pixel display area 01 and the peripheral wiring area 02. In the peripheral wiring area 02, the plurality of metal lines 60 are connected with the second electrode 60. By arranging the metal lines 60 between the base plate 10 and the first electrode 30, it is possible for the metal lines 60 and the second electrode 50 which are connected in parallel to act as an electrode of the array substrate, thus reducing resistivity of the electrode. In this manner, the plurality of metal lines 60, which lie in the same layer and which are connected with the second electrode 50, are required to be formed only in the peripheral wiring area 02.

Optionally, as shown in 1, due to the particularity of a material for the organic material functional layer 40 in an OLED, it is difficult for the electrode currently electrically connected with the drain 205 to cross the organic material functional layer 40 so as to be electrically connected with the drain 205. Thus, in embodiments of the present invention, it is preferably for the first electrode 30 to be electrically connected with the drain 205 of the TFT.

Based on the foregoing description, as shown in FIG. 3, the first gate 201 of the TFT 20 may be arranged closer to the first electrode 30 than the source 204 and the drain 205 of the TFT. In particular, forming the plurality of metal lines 60 in the same layer includes forming the plurality of metal lines a60 at the same time for forming the first gate first gate 201, wherein the first gate 201 and the plurality of metal lines 60 are insulated from each other. The first gate 201 and the metal lines 60 can be formed by the same patterning process, thus avoiding additional patterning.

In some embodiments, as shown in FIG. 4, after forming the first gate 201 and the plurality of metal lines 60 which lie in the same layer as the first gate 201, and prior to forming the first electrode 30, the method further comprises forming an organic insulating layer 70. Since the organic insulating layer 70 can be relatively thick, the effect of a scanning signal of the first gate 201 on a voltage of the first electrode 30 can be avoided as much as possible by setting appropriately the thickness of the organic insulating layer 70. Further, since the adhesion between the organic insulating layer 70 and the underlying components (the first gate 201 and metal lines 60), which are made from metallic materials, may not be strong, the method further comprises forming an adhesion layer 80 between the organic insulating layer 70 and the first gate 201/the metal lines 60, as shown in FIG. 5. The purpose of the adhesion layer 80 is to improve the adhesion strength between the organic insulating layer 70 and the first gate 201/the metal lines 60 of metallic materials.

Preferably, as shown in FIG. 6, the TFT 20 can further comprise a second gate 207, which corresponds to the first gate 201 in the perpendicular direction and is arranged closer to the base plate 10 than the source 204 and the drain 205. Here, a double-gate TFT is applied so as to increase the ON-state current, decrease the OFF-state current, and increase the threshold voltage stability of the TFT.

Based on the foregoing description, since a MOS has advantages of high electron mobility and excellent uniformity, and in order to avoid over-etching the MOS active layer during forming the source/drain electrode by etching in case the MOS active layer is arranged below the source 204 and the drain 205, two MOS active layers can be formed to avoid over-etching as mentioned above.

As shown in FIG. 7, forming the TFT 20 on the base plate 10 comprises forming in sequence a second gate 207, a second insulating layer 206, a second MOS active layer 203b, a source 204, a drain 205, a first MOS active layer 203a, a first insulating layer 202, and a first gate 201 on the base plate 10; wherein the first MOS active layer 203a contacts the second MOS active layer 203b via a gap between the source 204 and the drain 205.

A method for fabricating the OLED array substrate shown in FIG. 7 will be described hereinafter in a particular embodiment. As shown in FIG. 9, the method comprises the following steps.

S101: Form, in sequence, a second gate 207, a second insulating layer 206, a second MOS active layer 203b, a source 204, a drain 205, a first MOS active layer 203a, and a first insulating layer 202 on a base plate 10. The first MOS active layer 203a contacts the second MOS active layer 203b via a gap between the source 204 and the drain 205. All of the second gate 207, the second MOS active layer 203b, the source 204, the drain 205, and the first MOS active layer 203a are located in the effective pixel display area 01. The first insulating layer 202 and the second insulating layer 206 are located in both the effective pixel display area 01 and the peripheral wiring area 02.

S102: On the resultant substrate from S101, form a first gate 201 in the effective pixel display area 01, and at the same time, form a plurality of metal lines 60 which are parallel with each other. The metal lines 60 and the first gate 201 are formed such that they are insulated from each other, and any one of the metal lines 60 extends from the effective pixel display area 01 to the peripheral wiring area 02.

S103: On the resultant substrate from S102, form, in sequence, an adhesion layer 80 and an organic insulating layer 70 in the effective pixel display area 01 and the peripheral wiring area 02.

S104: On the resultant substrate from S103, form, in sequence, a first electrode 30 and an organic material functional layer 40 in the effective pixel display area 01. The first electrode 30 is electrically connected with the drain 205 via a via hole through the organic insulating layer 70, the adhesion layer 80, and the first insulating layer 202.

S105: On the resultant substrate from S104, form a second electrode 50 in the effective pixel display area 01 and the peripheral wiring area 02. The second electrode 50 in the peripheral wiring area 02 is electrically connected with each of the metal lines 60 via a via hole in the peripheral wiring area 02 through the organic insulating layer 70 and the adhesion layer 80.

The second electrode 50 and the metal lines 60 act as the cathode, and the second electrode 50 is electrically connected with the metal lines 60 in the peripheral wiring area 02. In this configuration, the connection between the second electrode 50 and the metal lines 60 occurs in the effective pixel display area 01, thus decreasing resistivity of the electrode. Since the second gate 207 and the metal lines 60 are arranged in the same layer, they can be formed in the same patterning process, thus avoiding an increase in the patterning process.

Although the present invention has been described above with reference to specific embodiments, it should be understood that the limitations of the described embodiments are merely for illustrative purpose and by no means limiting. Instead, the scope of the disclosure is defined by the appended claims rather than by the description, and all variations that fall within the range of the claims are intended to be embraced therein. Thus, other embodiments than the specific ones described above are equally possible within the scope of these appended claims.

What is claimed is:

1. An OLED array substrate, comprising:
an effective pixel display area and a peripheral wiring area, wherein the effective pixel display area comprises a TFT which is arranged on a base plate;
a first electrode, an organic material functional layer and a transparent second electrode which are arranged in sequence on a side of the TFT away from the base plate; and
a plurality of conductors which is arranged between the base plate and the first electrode;
wherein the plurality of conductors is located in both the effective pixel display area and the peripheral wiring area, and wherein, in the peripheral wiring area, the plurality of conductors is connected with the second electrode.

2. The array substrate of claim 1, wherein the plurality of conductors is a plurality of metal lines which lie in the same layer.

3. The array substrate of claim 2, wherein the TFT comprises:
a first gate, which is arranged closer to the first electrode than a source and a drain of the TFT, wherein the first gate and the plurality of metal lines are arranged in the same layer and are insulated from each other.

4. The array substrate of claim 3, wherein the array substrate further comprises an organic insulating layer which is arranged between the first gate and the first electrode.

5. The array substrate of claim 3, wherein the TFT further comprises a second gate, which corresponds to the first gate in the perpendicular direction, and which is arranged closer to the base plate than the source and the drain.

6. The array substrate of claim 5, wherein the TFT further comprises a MOS active layer which is arranged between the first gate and the second gate.

7. The array substrate of claim 6, wherein the MOS active layer comprises a first MOS active layer and a second MOS active layer, and
wherein the first MOS active layer is arranged close to the first gate, the second MOS active layer is arranged close to the second gate, and the first MOS active layer contacts the second MOS active layer via a gap between the source and the drain.

8. The array substrate of claim 1, wherein the first electrode is electrically connected with the drain of the TFT.

9. The array substrate of claim 8, wherein the first electrode at least comprises a metallic conducting layer.

10. An OLED display device, comprising the OLED array substrate of claim 1, and a package layer.

11. A method for fabricating an OLED array substrate, comprising: forming a TFT in an effective pixel display area of a base plate; and forming in sequence a first electrode, an organic material functional layer and a transparent second electrode on the substrate on which the TFT has been formed,
the method further comprises: forming a plurality of conductors between the base plate and the first electrode,
wherein the plurality of conductors is located in both the effective pixel display area and a peripheral wiring area, and wherein, in the peripheral wiring area, the plurality of conductors is connected with the second electrode.

12. The method of claim 11, wherein the plurality of conductors is a plurality of metal lines which lies in the same layer.

13. The method of claim 12, wherein the TFT comprises a first gate which is arranged closer to the first electrode than a source and a drain of the TFT, and
forming the plurality of metal lines which lies in the same layer comprises: forming the plurality of metal lines at the same time for forming the first gate, wherein the first gate and the plurality of metal lines are insulated from each other.

14. The method of claim 13, wherein after forming the first gate and the plurality of metal lines which lie in the same layer as the first gate, and prior to forming the first electrode, the method further comprises forming an organic insulating layer.

15. The method of claim 13, wherein the TFT further comprises a second gate, which corresponds to the first gate in the perpendicular direction, and which is arranged closer to the base plate than the source and the drain.

16. The method of claim 11, wherein forming the TFT in the effective pixel display area of the base plate comprises:
forming in sequence a second gate, a second insulating layer, a second MOS active layer, a source and a drain, a first MOS active layer, a first insulating layer, and a first gate on the base plate, wherein the first MOS active layer contacts the second MOS active layer via a gap between a source and a drain.

* * * * *